(12) United States Patent (10) Patent No.: US 10,847,950 B2
Onishi (45) Date of Patent: Nov. 24, 2020

(54) VERTICAL CAVITY SURFACE EMITTING LASER, METHOD FOR FABRICATING VERTICAL CAVITY SURFACE EMITTING LASER

(71) Applicant: SUMITOMO ELECTRIC INDUSTRIES, LTD., Osaka (JP)

(72) Inventor: Yutaka Onishi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/107,806

(22) Filed: Aug. 21, 2018

(65) Prior Publication Data

US 2019/0067908 A1 Feb. 28, 2019

(30) Foreign Application Priority Data

Aug. 23, 2017 (JP) ................................ 2017-160432

(51) Int. Cl.
*H01S 5/183* (2006.01)
*H01S 5/187* (2006.01)
(Continued)

(52) U.S. Cl.
CPC ............ *H01S 5/187* (2013.01); *H01L 21/246* (2013.01); *H01L 21/28575* (2013.01);
(Continued)

(58) Field of Classification Search
CPC .. H01S 5/187; H01S 5/18377; H01S 5/18313; H01S 5/3432; H01S 5/18327;
(Continued)

(56) References Cited

U.S. PATENT DOCUMENTS 6,570,905 B1 * 5/2003 Ebeling ................. B82Y 20/00
372/46.01
7,244,629 B2 * 7/2007 Ezaki .................. H01S 5/18355
257/E33.011
(Continued)

FOREIGN PATENT DOCUMENTS

EP 1387452 A1 * 2/2004 ............. B28Y 20/00
JP 2018082061 * 11/2016 ......... H01S 5/02276

OTHER PUBLICATIONS

Y.C. Chang et al., "High-efficiency, high-speed VCSELs with deep oxidation layers", Electronics Letters, vol. 42, No. 22, p. 1281-p. 1282 (2006).

*Primary Examiner* — Tod T Van Roy
*Assistant Examiner* — Delma R Fordé
(74) *Attorney, Agent, or Firm* — Smith, Gambrell & Russell, LLP.

(57) ABSTRACT

A vertical cavity surface emitting laser includes: a supporting base; and a post including an upper distributed Bragg reflecting region, an active layer, and a lower distributed Bragg reflecting region. The upper distributed Bragg reflecting region, the active layer, and the lower distributed Bragg reflecting region are arranged on the supporting base. The lower distributed Bragg reflecting region includes first semiconductor layers and second semiconductor layers alternately with each of the first semiconductor layers having a refractive index lower than that of each of the second semiconductor layers. The upper distributed Bragg reflecting region includes first layers and second layers alternately with each of the first layers having a group III-V compound semiconductor portion and a group III oxide portion. The group III-V compound semiconductor portion contains alu-
(Continued)

minum as a group III constituent element, and the group III oxide portion surrounds the group III-V compound semiconductor portion.

1 Claim, 8 Drawing Sheets

(51) Int. Cl.
| | |
|---|---|
| *H01S 5/042* | (2006.01) |
| *H01S 5/024* | (2006.01) |
| *H01S 5/343* | (2006.01) |
| *H01L 21/24* | (2006.01) |
| *H01L 21/285* | (2006.01) |
| *H01L 21/308* | (2006.01) |
| *H01S 5/30* | (2006.01) |

(52) U.S. Cl.
CPC ........ *H01L 21/308* (2013.01); *H01S 5/02461* (2013.01); *H01S 5/0421* (2013.01); *H01S 5/18313* (2013.01); *H01S 5/18327* (2013.01); *H01S 5/18333* (2013.01); *H01S 5/18361* (2013.01); *H01S 5/18369* (2013.01); *H01S 5/18372* (2013.01); *H01S 5/18377* (2013.01); *H01S 5/3432* (2013.01); *H01S 5/04257* (2019.08); *H01S 5/18311* (2013.01); *H01S 5/18358* (2013.01); *H01S 5/305* (2013.01); *H01S 5/3054* (2013.01); *H01S 5/34313* (2013.01); *Y10S 438/956* (2013.01)

(58) Field of Classification Search
CPC .............. H01S 5/02461; H01S 5/0421; H01S 5/18311; H01S 5/183; H01S 5/18361; H01S 5/18358; H01S 5/18308; H01S 5/18333; H01S 5/18369; H01S 5/18372; Y10S 438/956; H01L 21/246; H01L 21/28575

See application file for complete search history.

(56) References Cited

U.S. PATENT DOCUMENTS

| | | | | |
|---|---|---|---|---|
| 7,871,841 | B2 * | 1/2011 | Masui | H01S 5/18311 |
| | | | | 372/46.013 |
| 8,189,642 | B1 * | 5/2012 | Li | H01S 5/18352 |
| | | | | 372/46.013 |
| 9,360,845 | B2 * | 6/2016 | Kaneko | G04F 5/145 |
| 2004/0042517 | A1 * | 3/2004 | Steinle | H01S 5/18313 |
| | | | | 372/45.01 |
| 2005/0100068 | A1 * | 5/2005 | Jikutani | B82Y 20/00 |
| | | | | 372/46.01 |
| 2008/0240194 | A1 * | 10/2008 | Maeda | H01S 5/18355 |
| | | | | 372/50.1 |
| 2010/0208760 | A1 * | 8/2010 | Yoshikawa | H01S 5/1833 |
| | | | | 372/44.01 |
| 2011/0076854 | A1 * | 3/2011 | Takeo | H01S 5/18313 |
| | | | | 438/745 |
| 2012/0094408 | A1 * | 4/2012 | Onishi | H01S 5/18311 |
| | | | | 438/29 |
| 2018/0138660 | A1 * | 5/2018 | Hayakawa | H01S 5/18394 |
| 2018/0149809 | A1 * | 5/2018 | Tsuji | H01L 21/30621 |

* cited by examiner

US 10,847,950 B2

VERTICAL CAVITY SURFACE EMITTING LASER, METHOD FOR FABRICATING VERTICAL CAVITY SURFACE EMITTING LASER

BACKGROUND OF THE INVENTION

Field of the Invention

The present invention relates to a vertical cavity surface emitting laser and a method for fabricating a vertical cavity surface emitting laser. This application claims the benefit of priority from Japanese Patent Application No. 2017-160432 filed on Aug. 23, 2017, which is herein incorporated by reference in its entirety.

Related Background Art

Y. C. Chang et al., "High-efficiency, high-speed VCSELs with deep oxidation layers," Electronics Letters, vol. 42, no. 22, pp. 1281-1282, 2006 discloses a vertical cavity surface emitting laser.

SUMMARY OF THE INVENTION

A vertical cavity surface emitting laser according to one aspect includes: a supporting base: and a post including an upper distributed Bragg reflecting region, an active layer, and a lower distributed Bragg reflecting region, and the upper distributed Bragg reflecting region, the active layer, and the lower distributed Bragg reflecting region being arranged on the supporting base. The lower distributed Bragg reflecting region includes first semiconductor layers and second semiconductor layers alternately arranged. The first semiconductor layers each have a refractive index lower than that of each of the second semiconductor layers. The upper distributed Bragg reflecting region includes first layers and second layers alternately arranged. The first layers each have a group III-V compound semiconductor portion and a group III oxide portion. The group III-V compound semiconductor portion contains aluminum as a group III constituent element. The group III oxide portion surrounds the group III-V compound semiconductor portion.

A method for fabricating a vertical cavity surface emitting laser according to another aspect includes: preparing an epitaxial substrate, the epitaxial substrate including a lower semiconductor laminate for a lower distributed Bragg reflecting region, a semiconductor laminate for an active layer, and an upper semiconductor laminate for an upper distributed Bragg reflecting region; forming a mask on the epitaxial substrate; etching the upper semiconductor laminate and the semiconductor laminate of the epitaxial substrate with the mask to form a substrate product, the mask having a pattern defining a post for the vertical cavity surface emitting laser, and the substrate product having an upper part of the post; exposing the upper part of the substrate product to an oxidizing atmosphere; and after exposing the upper part of the substrate product to the oxidizing atmosphere, etching the lower semiconductor laminate to form a lower part of the post. The upper semiconductor laminate has a semiconductor layer of III-V compound semiconductor containing aluminum as a group III constituent element. The semiconductor layer reaches a side of the post. Exposing the upper part of the substrate product to an oxidizing atmosphere includes producing a current confining structure from the semiconductor layer. The current confining structure has an insulating portion and a current aperture portion of the III-V compound semiconductor.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

DESCRIPTION OF THE EMBODIMENTS

Figure 1:
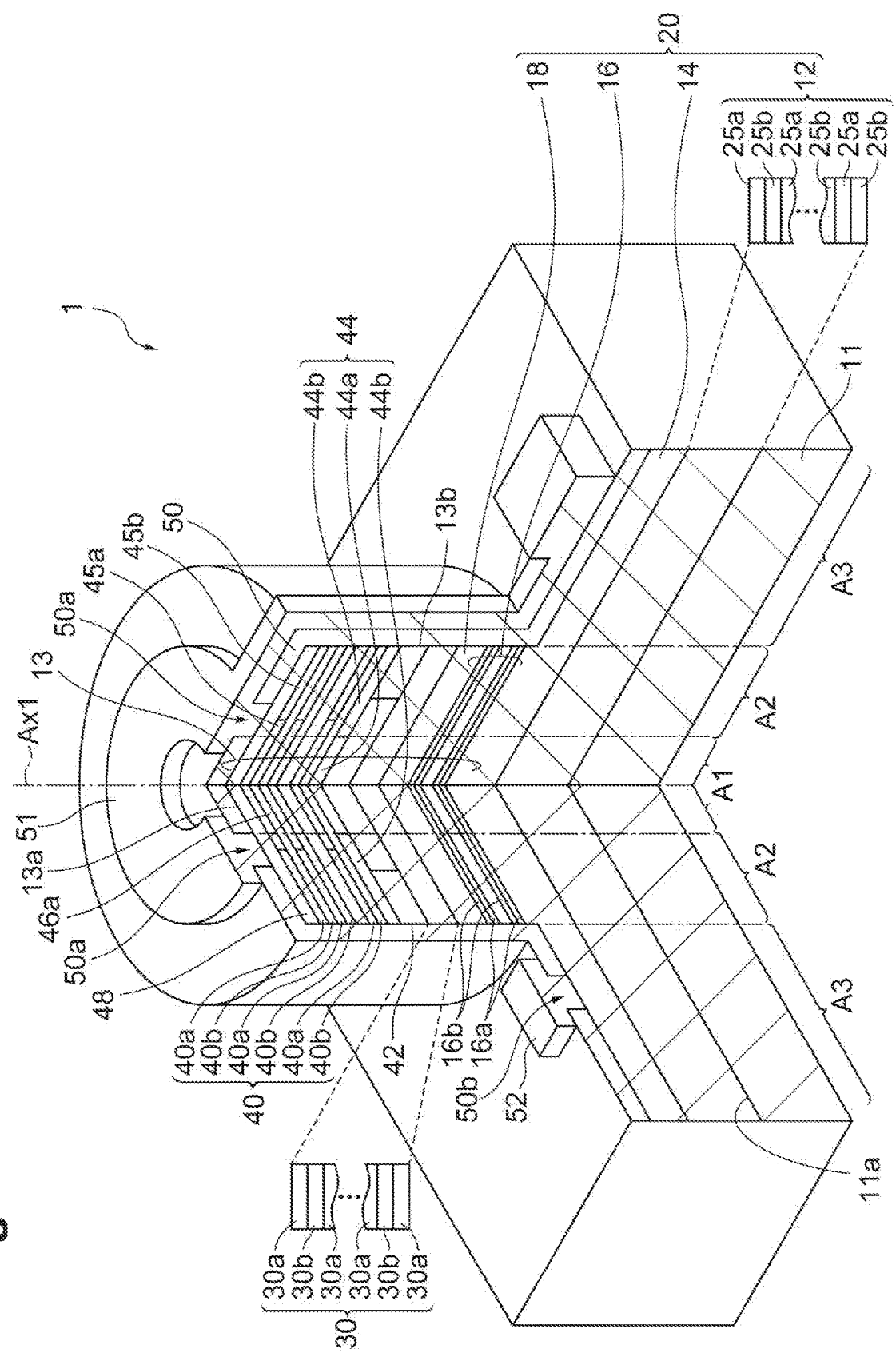
FIG. 1 is a partially cut-away perspective view showing a vertical cavity surface emitting laser according to the embodiment.

A vertical cavity surface emitting laser with a post structure is fabricated through, for example, the following process steps. A semiconductor stack for a lower distributed Bragg reflecting region, an active layer, and an upper distributed Bragg reflecting region is etched to form a post including a stack of semiconductor layers for the lower and upper distributed Bragg reflection regions and the active layer. The post is exposed to an oxidizing atmosphere to produce a current confining structure therein from an aluminum-containing semiconductor layer for the current confining structure. The current confining structure has an annular oxide region. The oxidizing atmosphere oxidizes all of aluminum-containing semiconductor layers in the post, which includes the stack of semiconductor layers for the lower and upper distributed Bragg reflection regions and the active layer, in accordance with their aluminum compositions. The oxidizing process changes all of the aluminum-containing semiconductor layers in the post into respective complex layers, each of which includes an annular oxide region and an inner semiconductor region inside the oxide region. The application of the oxidizing process to the post results in that these complex layers, each including the annular oxide region and the inner semiconductor region thus formed, are formed in not only the upper distributed Bragg reflection region but also the lower distributed Bragg reflection region.

The lower distributed Bragg reflection region lies in the dissipation path of heat, which is generated by the active layer during operation. The inventor's findings reveal that the complex layers in the lower distributed Bragg reflection region, which is provided with the multiple oxide regions, make the heat dissipation performance lowered.

It is an object of one aspect of the present invention to provide a vertical cavity surface emitting laser having an excellent thermal conductivity in a path allowing dissipation of heat from the active layer. It is an object of another aspect of the present invention to provide a method for fabricating a vertical cavity surface emitting laser, and the method can form a path, which has an excellent thermal conductivity, to allow dissipation of heat from the active layer.

A description will be given of embodiments according to the above aspects.

A vertical cavity surface emitting laser according to an embodiment includes: (a) a supporting base: and (b) a post including an upper distributed Bragg reflecting region, an active layer, and a lower distributed Bragg reflecting region, and the upper distributed Bragg reflecting region, the active layer, and the lower distributed Bragg reflecting region being arranged on the supporting base. The lower distributed Bragg reflecting region includes first semiconductor layers and second semiconductor layers alternately arranged. The first semiconductor layers each have a refractive index lower than that of each of the second semiconductor layers. The upper distributed Bragg reflecting region includes first layers and second layers alternately arranged. The first layers each have a group III-V compound semiconductor portion and a group III oxide portion. The group III-V compound semiconductor portion contains aluminum as a group III constituent element. The group III oxide portion surrounds the group III-V compound semiconductor portion.

The vertical cavity surface emitting laser allows the lower distributed Bragg reflecting region, all of which is made of semiconductor, to dissipate heat, generated by the active layer during operation, through the lower distributed Bragg reflecting semiconductor region.

In the vertical cavity surface emitting laser according to an embodiment, the first semiconductor layers of the lower distributed Bragg reflecting region each have an aluminum composition not less than that of the group III-V compound semiconductor portion of each of the first layers of the upper distributed Bragg reflecting region.

The vertical cavity surface emitting laser provides the first semiconductor layer, which has a refractive index lower than that of the second semiconductor layer in the lower DBR semiconductor region, with an aluminum composition equal to or higher than that of the III-V compound semiconductor portion of the first layer in the upper DBR region. III-V compound semiconductor with a high aluminum composition has an excellent thermal conductivity.

In the vertical cavity surface emitting laser according to an embodiment, the upper distributed Bragg reflecting region includes a current confining structure. The current confining structure has a current aperture portion and an insulating portion. The current aperture portion includes a group III-V compound semiconductor. The insulating portion surrounds the current aperture. The first semiconductor layers each have an aluminum composition not less than that of the current aperture portion.

The vertical cavity surface emitting laser provides the first semiconductor layer, which has a refractive index lower than that of the second semiconductor layer in the lower DBR semiconductor region, with an aluminum composition equal to or higher than that of the current aperture portion of the upper DBR region. III-V semiconductor of a high aluminum composition exhibits an excellent thermal conductivity.

In the vertical cavity surface emitting laser according to an embodiment, the aluminum composition of each of the first semiconductor layers is larger than that of the current aperture portion.

The vertical cavity surface emitting laser provides the first semiconductor layer, which has a refractive index lower than that of the second semiconductor layer in the lower DBR semiconductor region, with an aluminum composition larger than that of the current aperture of the upper DBR region. Semiconductor with a high aluminum composition has an excellent thermal conductivity.

A method for fabricating a vertical cavity surface emitting laser according to an embodiment includes: (a) preparing an epitaxial substrate, the epitaxial substrate including a lower semiconductor laminate for a lower distributed Bragg reflecting region, a semiconductor laminate for an active layer, and an upper semiconductor laminate for an upper distributed Bragg reflecting region; (b) forming a mask on the epitaxial substrate; (c) etching the upper semiconductor laminate and the semiconductor laminate of the epitaxial substrate with the mask to form a substrate product, the mask having a pattern defining a post for the vertical cavity surface emitting laser, and the substrate product having an upper part of the post; (d) exposing the upper part of the substrate product to an oxidizing atmosphere; and (e) after exposing the upper part of the substrate product to the oxidizing atmosphere, etching the lower semiconductor laminate to form a lower part of the post. The upper semiconductor laminate has a semiconductor layer of III-V compound semiconductor containing aluminum as a group III constituent element. The semiconductor layer reaches a side of the post. Exposing the upper part of the substrate product to an oxidizing atmosphere includes producing a current confining structure from the semiconductor layer. The current confining structure has an insulating portion and a current aperture portion of the III-V compound semiconductor.

In the method for fabricating the vertical cavity surface emitting laser, the epitaxial substrate is etched to form the upper portion of the post. Before forming the lower portion of the post, the upper portion of the post is exposed to an oxidizing atmosphere to produce a current confining structure from the semiconductor layer in the upper portion of the post. After forming the current confining structure, the lower semiconductor laminate is etched to form the lower portion of the post. This order of the process steps allows the lower portion of the post to be exposed to no high-temperature oxidizing atmosphere.

Teachings of the present invention can be readily understood by considering the following detailed description with reference to the accompanying drawings shown as examples. Referring to the accompanying drawings, embodiments of a vertical cavity surface emitting laser, and a method for fabricating a vertical cavity surface emitting laser according to the above aspects will be described below. To facilitate understanding, identical reference numerals are used, where possible, to designate identical elements that are common to the figures.

FIG. 1 is a partially cut-away schematic view showing a vertical cavity surface emitting laser according to the embodiment. The vertical cavity surface emitting laser 1, 1a, and 1b (hereinafter referred to as the "vertical cavity surface emitting laser 1" in the description with reference to FIG. 1) includes a supporting base 11 and a post 13. The supporting base 11 has a principal face 11a, which includes a III-V compound semiconductor. The post 13 includes a lower distributed Bragg reflector (hereinafter referred to as "DBR") semiconductor region (hereinafter referred to as "lower DBR semiconductor region") 16, an active layer 30, and an upper distributed Bragg reflection region (hereinafter referred to as "upper DBR region") 40. The lower DBR semiconductor region 16, the active layer 30, and the upper DBR region 40 are sequentially arranged on the supporting base 11. The lower DBR semiconductor region 16 includes first semiconductor layers 16a and second semiconductor layers 16b, which are alternately arranged in the direction of the first axis Ax1 to enable Bragg reflection. Each of the first semiconductor layers 16a has a lower refractive index than that of each of the second semiconductor layers 16b. The upper DBR region 40 includes first layers 40a and second layers 40b, which are alternately arranged in the direction of the first axis Ax1 to enable Bragg reflection, Each of the first layers 40a includes a semiconductor portion 45a of III-V compound semiconductor and a group III oxide portion 45b, which is produced from the III-V compound semiconductor by oxidation. The semiconductor portion 45a of the first layer 40a contains aluminum as a group III constituent element. The group III oxide portion 45b is made of oxide containing aluminum as a group III element and encircles the semiconductor portion 45a. Each of the second layers 40b includes a semiconductor portion 46a of a III-V compound semiconductor.

The vertical cavity surface emitting laser 1 can dissipate heat, generated by the active layer 30 during operation, through the lower DBR semiconductor region 16, all of which is made of semiconductor.

The post 13 has an upper face 13a and a side face 13b. The side face 13b extends in the direction of the first axis Ax1, and the upper face 13a extends along the reference plane that intersects the first axis Ax1, which intersects the principal surface 11a of the supporting base 11. The side face 13b may have a part extending substantially perpendicular to the principal surface 11a of the supporting base 11, and if needed, may have a sloping part that extends obliquely with respect to the principal surface 11a of the supporting base 11.

In the lower DBR semiconductor region 16, the first and second semiconductor layers 16a and 16b reach the side face 13b of the post 13. Specifically, the first semiconductor layer 16a is made of a first III-V compound semiconductor, and the second semiconductor layer 16b is made of a second III-V compound semiconductor, which is different from the first III-V compound semiconductor of the first semiconductor layer 16a. Combining the first III-V compound semiconductor with the second III-V compound semiconductor can provide the interface between the first and second semiconductor layers 16a and 16b, adjoining to each other, with a refractive index difference, and for example, the first semiconductor layer 16a has a refractive index lower than that of the second semiconductor layer 16b. In the post 13, the first semiconductor layer 16a has a semiconductor side face made of the first III-V compound semiconductor, and the second semiconductor layer 16b has a semiconductor side face made of the second III-V compound semiconductor. The side 13b of the post 13 includes the semiconductor side faces of the first and second semiconductor layers 16a and 16b.

The principal surface 11a of the supporting base 11 includes a first area A1, a second area A2 surrounding the first area A1, and a third area A3 surrounding the first and second areas A1 and A2. In the present embodiment, the second area A2 is in contact with the first area A1, and the third area A3 is in contact with the second area A2. The post 13 has a bottom and is disposed on the principal surface of the substrate in the first areas A1 and A2, and is not disposed on the third area A3. The supporting base 11 includes, for example, i-type GaAs.

The upper DBR region 40 according to the embodiment can provide a first layer 40a thereof with the III-V compound semiconductor portion, which is between the compound semiconductor portions of second layers 40b, which adjoin to the first layer 40a, on respective sides of the first layer 40a, and can provide the first layer 40a with a group III oxide region which is between the compound semiconductor portions of the second layers 40b on the respective sides of the first layer 40a. The III-V compound semiconductor portion of the second layer 40b contains aluminum as a group III constituent element, and the group III oxide portion of the second layer 40b encircles the III-V compound semiconductor portion.

In the second layer 40b according to the embodiment, the III-V compound semiconductor portion has an aluminum composition of greater than or equal to zero, and smaller than that of the compound semiconductor portion 45a of the first layer 40a.

Specifically, the second layer 40b may include a group III-V compound semiconductor which contains substantially no aluminum as a group-III constituent element. The second layer 40b has a side face of semiconductor, which the side face 13b of the post 13 includes. The III-V compound semiconductor portion of the second layer 40b reaches the side face 13b of the post 13. Alternatively, the second layer 40b can include a III-V compound semiconductor containing aluminum as a group III constituent element. The second layer 40b has a side face of the group III oxide portion, which is outside the semiconductor portion, at the side face 13b of the post 13.

In the second layer 40b according to the embodiment, which includes a III-V compound semiconductor with aluminum as a group III constituent element, the second layer 40b is provided with the group-III oxide portion and the III-V compound semiconductor portion. The group III oxide portion of the second layer 40b in the second area A2 is disposed between the group III oxide portions 45b of the first layers 40a, which adjoin to the second layer 40b, on respective sides of the second layer 40b. In the second area A2, the III-V compound semiconductor portion of the second layer 40b is disposed between the group III oxide portions 45b of the first layers 40a on the respective sides of the second layer 40b. In the second area A2, the III-V compound semiconductor portion of the second layer 40b is disposed between the compound semiconductor portions 45a of the first layers 40a, which adjoin to the second layer 40b, on the respective sides of the second layer 40b. In the first area A1, the III-V compound semiconductor portion of the second layer 40b is disposed between the compound semiconductor portions 45a of the first layers 40a, which adjoin to the second layer 40b, on the respective sides of the second layer 40b.

In the vertical cavity surface emitting laser 1, the upper DBR region 40 includes a current confining structure 44, which includes a current aperture portion 44a of a III-V compound semiconductor containing aluminum as a group III constituent element, and an insulating portion 44b. The current aperture portion 44a has an aluminum composition, which is largest in the upper DBR region 40. The insulating portion 44b encircles the current aperture portion 44a. The current aperture portion 44a and the insulating portion 44b are arranged along a reference plane intersecting the first axis Ax1. Specifically, the current aperture portion 44a has a III-V compound semiconductor of, for example, AlAs or AlGaAs, and the aluminum composition of the AlGaAs is, for example, 0.98. The upper DBR region 40 is provided with the arrangement of the first and second layers 40a and 40b on the current confining structure 44, and can be provided with the arrangement of the first and second layers 40a and 40b under the current confining structure 44.

The lower DBR semiconductor region 16 includes no group-III oxide, which has a thermal conductivity lower than that of the III-V compound semiconductor of the lower DBR semiconductor region 16. The lower DBR semiconductor region 16, all of which is made of semiconductor, allows heat, generated by the active layer 30 during operation, to spread over the entire cross-section of the post 13, thereby dissipating the heat through the entire lower DBR semiconductor region 16 in the post 13 to the supporting base 11. Specifically, the lower DBR semiconductor region provides the first semiconductor layer 16a with an aluminum composition equal to or higher than that of the III-V compound semiconductor of the current aperture portion 44a of the upper DBR region 40. III-V semiconductors with a high aluminum composition exhibit an excellent thermal conductivity.

The principal surface 11a of the supporting base 11 is provided with the first area A1, the second area A2, and the third area A3. The second area A2 encircles the first area A1, and the third area A3 encircles the first and second areas A1 and A2. In the present embodiment, the second area A2 is in contact with the first area A1, and the third area A3 is in contact with the second area A2.

In the embodiment, the lower DBR semiconductor region 16 is provided with the first and second semiconductor layers 16a and 16b on the first areas A1 and A2. In the post 13, the lower DBR semiconductor region 16 is located on the first and second areas A1 and A2.

The post 13 has a bottom on the principal surface of the substrate in the first areas A1 and A2, and is not disposed on the third area A3. The vertical cavity surface emitting laser 1 further includes a lower contact layer 14, which includes a III-V compound semiconductor. The bottom of the post 13 is in the lower contact layer 14. In the present embodiment, the lower contact layer 14 includes an upper portion and a lower portion. The post 13 includes the upper portion of the lower contact layer 14, and excludes the lower portion, which is on the first to third areas A1, A2, and A3, of the lower contact layer 14. The lower contact layer 14 includes, for example, n-type GaAs.

The vertical cavity surface emitting laser 1 further includes a DBR region 12 in addition to the lower DBR semiconductor region 16 and the lower contact layer 14. The DBR region 12 extends over the first to third areas A1, A2, and A3. The DBR region 12, the lower contact layer 14, and the lower DBR semiconductor region 16 form the lower DBR region 20. In the lower DBR region 20, the DBR region 12, the lower contact layer 14, and the lower DBR semiconductor region 16 are sequentially arranged on the supporting base 11 along the first axis Ax1. The DBR region 12 may include an i-type III-V compound semiconductor. Specifically, the DBR region 12 includes first semiconductor layers 25a and second semiconductor layers 25b, which are alternately arranged in the direction of the first axis Ax1. Each of the first semiconductor layers 25a has a refractive index lower than that of each of the second semiconductor layers 25b. The first and second semiconductor layers 25a and 25b include, for example, i-type GaAs and i-type AlGaAs, respectively, and the aluminum composition of AlGaAs can be, for example, 0.9.

In the upper DBR region 40 according to the embodiment, the compound semiconductor portion 45a and the group III oxide portion 45b of the first layer 40a are disposed on the first and second areas A1 and A2, respectively. The III-V compound semiconductor of the second layer 40b is disposed on both the first and second areas A1 and A2. In particular, the second layer 40b of a III-V compound semiconductor, which has an aluminum composition lower than that of the compound semiconductor portion 45a of the first layer 40a and larger than zero, has a III-V compound semiconductor region on the first and second areas A1 and A2, and has a group-III oxide region on the second area A2.

The vertical cavity surface emitting laser 1 further includes an upper contact layer 48, which is disposed on the upper DBR region 40. The upper contact layer 48 has a dopant concentration higher than that of the semiconductor layer just under the upper contact layer 48 (the semiconductor layer in the upper DBR region 40), and if possible, may have a band gap smaller than that of the semiconductor layer just under the upper contact layer 48. The upper DBR region 40 and the upper contact layer 48 are sequentially arranged in the direction of the first axis Ax1. The upper contact layer 48 includes a III-V compound semiconductor, such as p-type GaAs or p-type AlGaAs.

The active layer 30 includes, for example, a III-V compound semiconductor, which has a quantum well structure. The active layer 30 has a quantum well structure, such as an InGaAs/GaAs, formed in the first axis Ax1. The active layer 30 includes one or more well layers 30a and multiple barrier layers 30b, and the well layers 30a and the barrier layers 30b are arranged in the direction of the first axis Ax1.

The vertical cavity surface emitting laser 1 may include a lower spacer layer 18 and an upper spacer layer 42. The active layer 30 is disposed between the lower and upper spacer layers 18 and 42. The lower spacer layer 18 includes a III-V compound semiconductor, and the upper spacer layer 42 includes a III-V compound semiconductor. The lower and upper spacer layers 18 and 42 are grown as undoped AlGaAs, and the AlGaAs has an aluminum composition of, for example, 0.30. The vertical cavity surface emitting laser 1 has a laser cavity which includes the lower DBR semiconductor region 16, the active layer 30, and the upper DBR region 40.

The post 13 is provided with the active layer 30, the upper semiconductor region on the active layer 30, and the lower semiconductor region under the active layer 30. In the present embodiment, the upper semiconductor region has an upper laminate including the upper contact layer 48, the upper DBR region 40 and the upper spacer layer 42. In the upper laminate, the semiconductor layers each of which contains aluminum as the group III constituent element are surrounded by respective aluminum oxide layers. The lower semiconductor region includes the lower contact layer 14, the lower DBR semiconductor region 16 and the lower spacer layer 18. Regardless of presence or absence of aluminum as a group III constituent element, the semiconductor layers of the lower contact layer 14 and the lower DBR semiconductor region 16 have no oxide region that extends inward from the side face of the post 13.

In the upper DBR region 40 according to the embodiment, the first layer 40a includes, for example, p-type AlGaAs, and the AlGaAs has an aluminum composition of, for example, 0.9. The second layer 40b includes, for example, p-type GaAs or p-type AlGaAs. The first layer 40a has a refractive index larger than that of the second layer 40b.

In the upper DBR region 40, both the upper spacer layer 42 and the first layer 40a of the upper DBR region 40 contain aluminum as a group III constituent element and have respective group III oxide portions on the second area A2. Both the first layer 40a and the upper spacer layer 42 each have a compound semiconductor portion on the first area A1, but have no group III oxide portion.

In the vertical cavity surface emitting laser 1, the first semiconductor layer 16a of the lower DBR semiconductor region 16 has an aluminum composition equal to or greater than that of the compound semiconductor portion 45a of the first layer 45 of the upper DBR region 40. The first semiconductor layer 16a, which has a refractive index lower than that of the second semiconductor layer 16b in the lower DBR semiconductor region 16, has an aluminum composition equal to or higher than that of the compound semiconductor portion 45a of the first layer 45 of the upper DBR region 40. Semiconductor of a high aluminum composition has a high thermal conductivity.

The upper DBR region 40 has a current confining structure 44, and the current confining structure 44 includes an insulating portion 44b and a current aperture portion 44a of a III-V compound semiconductor containing aluminum as a group III constituent element. The insulating portion 44b encircles the current aperture portion 44a. The first semiconductor layer 16a of the lower DBR semiconductor region 16 may have an aluminum composition equal to or higher than that of the current aperture portion of the upper DBR region. The first semiconductor layer 16a, which has a refractive index lower than that of the second semiconductor layer 16b in the lower DBR semiconductor region 16, has an aluminum composition equal to or higher than that of the current aperture portion 44a of the upper DBR region 40. P-type AlGaAs semiconductor and p-type GaAs semiconductor each have a high thermal conductivity.

The first semiconductor layer 16a of the lower DBR semiconductor region 16 has an aluminum composition larger than that of the current aperture portion 44a of the upper DBR region 40. The first semiconductor layer 16a, which has a refractive index lower than that of the second semiconductor layer 16b in the lower DBR semiconductor region 16, has an aluminum composition larger than that of the current aperture portion 44a of the upper DBR region 40.

The vertical cavity surface emitting laser 1 has a protective film 50 covering the post 13 and the lower contact layer 14. Specifically, the protective film 50 covers the upper face 13a and the side face 13b of the post 13 and the top face of the lower contact layer 14, and the protective film 50 has a first opening 50a and a second opening 50b on the top face of the upper contact layer 48 and the top face of the lower contact layer 14, respectively. The protective film 50 includes a silicon-based inorganic insulating film, such as SiN or $SiO_2$. In the embodiment, the vertical cavity surface emitting laser 1 has a first electrode 51 in contact with the upper contact layer 48 via the first opening 50a on the upper face 13a of the post 13 and a second electrode 52 in contact with the lower contact layer 14 via the second opening 50b on the lower contact layer 14 outside the post 13.

Figure 2:
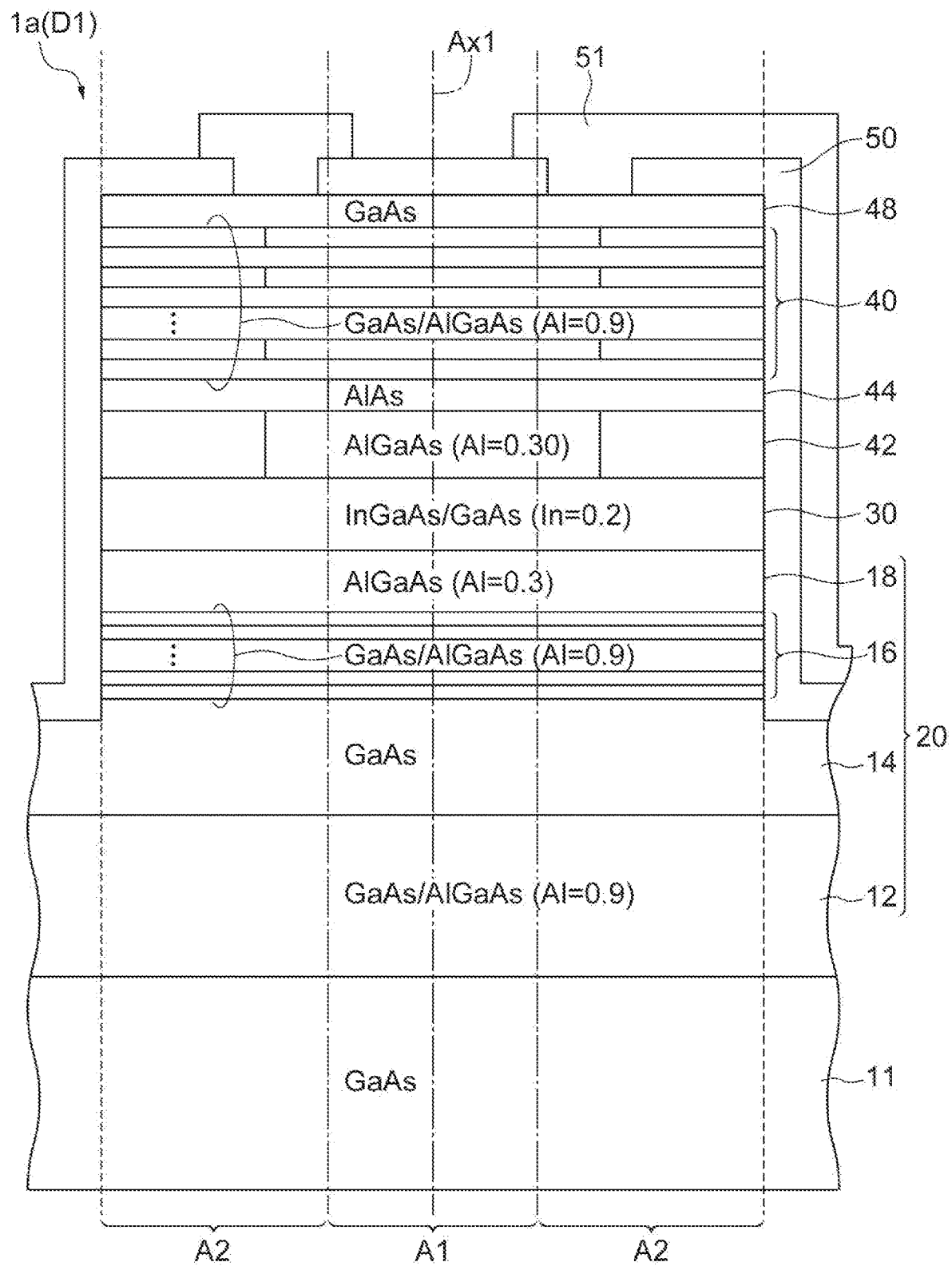
FIG. 2 is a schematic diagram showing the laminate structure of the vertical cavity surface emitting laser according to Example 1.
Figure 3:
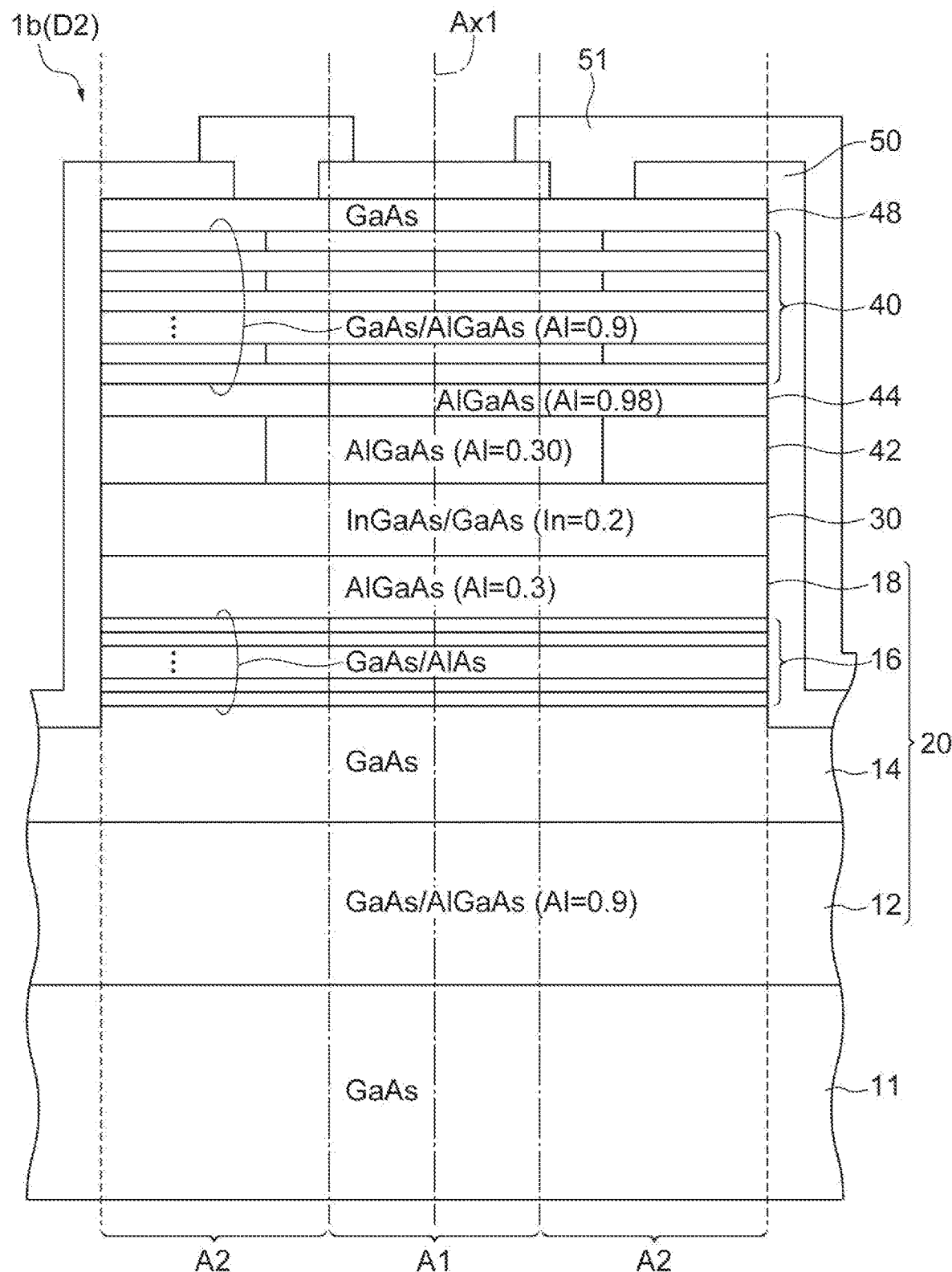
FIG. 3 is a schematic diagram showing the laminate structure of the vertical cavity surface emitting laser according to Example 2.
Figure 4:
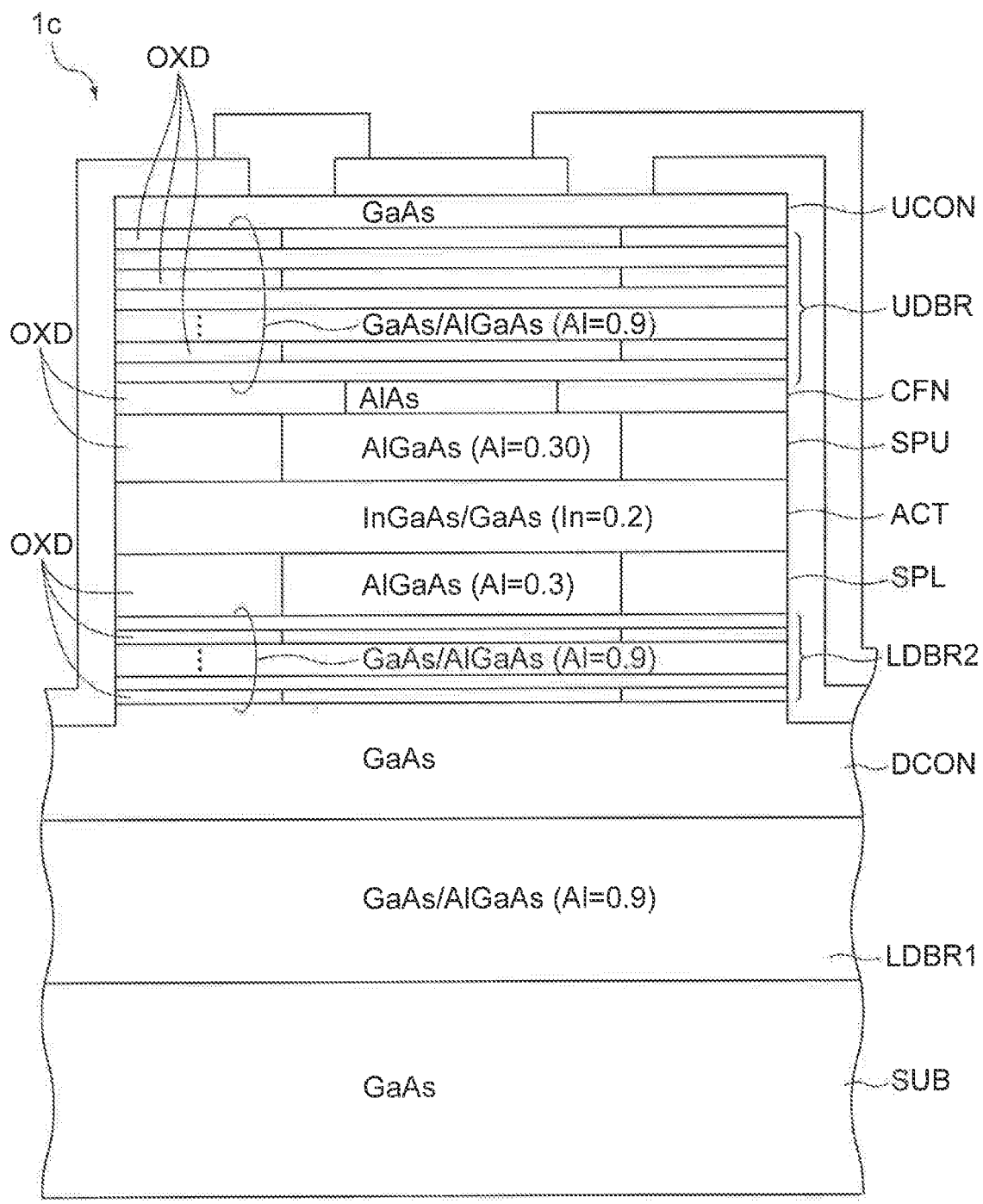
FIG. 4 is a schematic diagram showing the laminate structure, which has an oxide region extending inward from the side face of the post, of the vertical cavity surface emitting laser, in the lower DBR region in the post.

FIG. 2 is a schematic view showing the laminate structure of a vertical cavity surface emitting laser according to Example 1. FIG. 3 is a view showing a laminate structure of a vertical cavity surface emitting laser according to Example 2. FIG. 4 is a schematic view showing the laminate structure of a vertical cavity surface emitting laser with oxide regions, extending inward from the side of the post, in the lower DBR region in the post. The vertical cavity surface emitting lasers (D1 and D2) shown in Ms. 2 and 3 have the following common structure, Supporting base 11: i-type GaAs semiconductor substrate.
DBR region 12: GaAs/AlGaAs superlattice.
Aluminum composition of i-type AlGaAs: 0.9.
Thickness of i-type GaAs: 70 nm.
Thickness of i-type AlGaAs: 82 nm
Number of stacked layers of GaAs/AlGaAs superlattice: 80 cycles.
Lower contact layer 14: Si-doped GaAs.
GaAs thickness: 210 nm.
Dopant concentration: $3 \times 10^{18}$ $cm^{-3}$.
Lower spacer layer 18: AlGaAs.
Aluminum composition of AlGaAs: 0.30.
Thickness of AlGaAs: 126 nm.
Active layer 30: InGaAs/GaAs quantum well structure (the number of stacked layers: 6 cycles).
Indium composition of InGaAs: 0.2.
Thickness of InGaAs: 5 nm.
Thickness of GaAss: 7 nm.
Thickness of the active layer 30: 28 to 60 nm, for example 43 nm.
Upper spacer layer 42 (having an oxide on the side of the post): undoped AlGaAs.
Aluminum composition of AlGaAs: 030.
Thickness of AlGaAs: 5 to 400 nm, for example 106 nm.
DBR region 40 (having an oxide on the side of the post): GaAs/AlGaAs superlattice.
Aluminum composition of AlGaAs: 0.9.
P-type GaAs: C-doped GaAs with a thickness of 70 nm.
P-type AlGaAs: C-doped AlGaAs with a thickness of 82 nm.
Number of stacked layers of GaAs/AlGaAs superlattice: 40 cycles.
Dopant concentration: $2 \times 10^{18}$ $cm^{-3}$.
Upper contact layer 48: GaAs.
Thickness of GaAs: C-doped GaAs with a thickness of 20 nm
Dopant concentration: $5 \times 10^{19}$ $cm^{-3}$.
The vertical cavity surface emitting laser (D1) shown in FIG. 2 has the following structure.
Lower DBR semiconductor region 16: n-type GaAs/AlGaAs superlattice.
N-type AlGaAs: Si-doped AlGaAs with a thickness of 82 nm.
Aluminum composition of AlGaAs: 0.9.
N-type GaAs: Si-doped GaAs with a thickness of 70 nm.
Number of stacked layers of GaAs/AlGaAs superlattice: 8 cycles.
Dopant concentration: $1 \times 10^{18}$ $cm^{-3}$.
Current confining structure 44 (the constricting layer to be oxidized): C-doped AlAs.
Thickness of AlAs: 10 to 50 nm, for example 20 nm.
Dopant concentration: $2 \times 10^{18}$ $cm^{-3}$.
The vertical cavity surface emitting laser (D2) shown in FIG. 3 has the following structure.

Lower DBR semiconductor region 16: GaAs/AlAs superlattice.
Thickness of n-type GaAs: Si-doped GaAs of 70 nm.
Thickness of n-type AlAs: Si-doped AlAs with 83 nm.
Number of stacked layers of GaAs/AlAs superlattice: 8 cycles.
Dopant concentration: $1 \times 10^{18}$ cm$^{-3}$.
Current confining structure 44 (the confining layer to be oxidized): C-doped AlGaAs.
Aluminum composition of AlGaAs: 0.98.
Thickness of AlGaAs: 10 to 50 nm, for example 20 nm.
Dopant concentration: $2 \times 10^{18}$ cm$^{-3}$.

The vertical cavity surface emitting laser (C) shown in FIG. 4 has the following structure. In FIG. 4, "OXD" represents an oxide.
Substrate SUB: i-type GaAs semiconductor substrate.
DBR region LDBR1: GaAs/AlGaAs superlattice.
Aluminum composition of i-type AlGaAs: 0.9.
Thickness of i-type GaAs: 70 nm.
Thickness of i-type AlGaAs: 82 nm.
Number of stacked layers of GaAs/AlGaAs superlattice: 80 cycles.
Lower contact layer DCON: Si-doped GaAs.
Thickness of GaAs: 210 nm.
Dopant concentration: $3 \times 10^{18}$ cm$^{-3}$.
Lower DBR region LDBR2 (oxide on the side face of the post): N-type GaAs/AlGaAs superlattice.
N-type AlGaAs: Si-doped AlGaAs with a thickness of 82 nm.
Aluminum composition of AlGaAs: 0.9.
N-type GaAs: Si-doped GaAs with a thickness of 70 nm.
Number of stacked layers of GaAs/AlGaAs superlattice: 8 cycles.
Dopant concentration: $1 \times 10^{18}$ cm$^{-3}$.
Lower spacer layer SPL (oxide on the side face of the post): AlGaAs.
Aluminum composition of AlGaAs: 0.30.
Thickness of AlGaAs: 126 nm.
Active layer ACT: InGaAs/GaAs quantum well structure (Number of stacked layers: 6 cycles).
Indium composition of InGaAs: 0.2.
InGaAs thickness: 5 nm.
Thickness of GaAs: 7 nm.
The thickness of the active layer ACT: 28 to 60 nm, for example 43 nm.
Upper spacer layer SPU (oxide on the side face on the post): undoped AlGaAs.
Aluminum composition of AlGaAs: 0.30.
AlGaAs thickness: 5 to 400 nm, for example 106 nm.
Current confinement structure (oxidized confining layer) CFN: C-doped AlAs.
AlAs thickness: 20 nm.
Dopant concentration: $2 \times 10^{18}$ cm$^{-3}$.
DBR region UDBR (oxide on the side of the post): GaAs/AlGaAs superlattice.
Aluminum composition of AlGaAs: 0.9.
P-type GaAs: C-doped GaAs with a thickness of 70 nm.
P-type AlGaAs: C-doped AlGaAs with a thickness of 82 nm.
Number of stacked layers of GaAs/AlGaAs superlattice: 40 cycles.
Dopant concentration: $2 \times 10^{18}$ cm$^{-3}$.
Upper contact layer UCON: GaAs.
GaAs thickness: C-doped GaAs with a thickness of 20 nm.
Dopant concentration: $5 \times 10^{19}$ cm$^{-3}$.

Figure 5A:
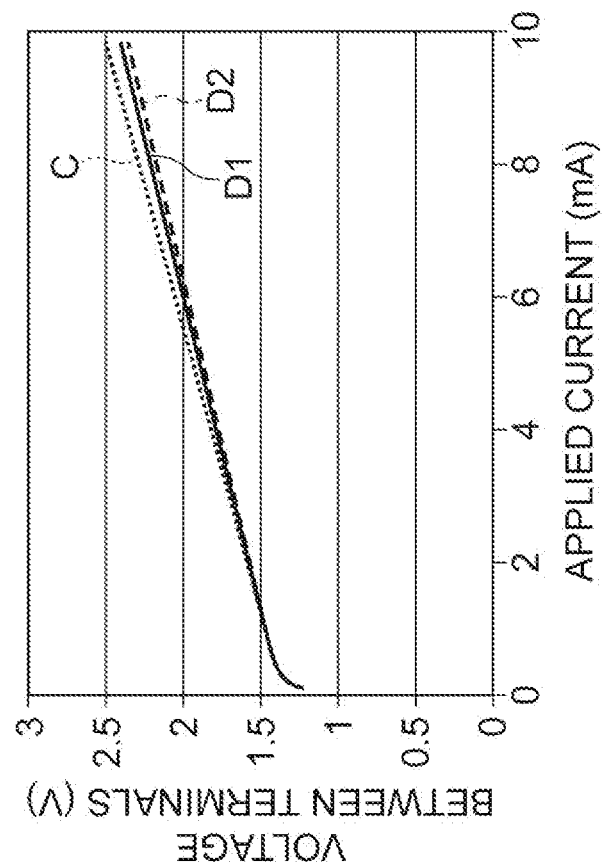
FIG. 5A is a graph showing a relationship between the applied current and the optical output intensity in three kinds of vertical cavity surface emitting lasers different from each other in laminate structure.
Figure 5B:
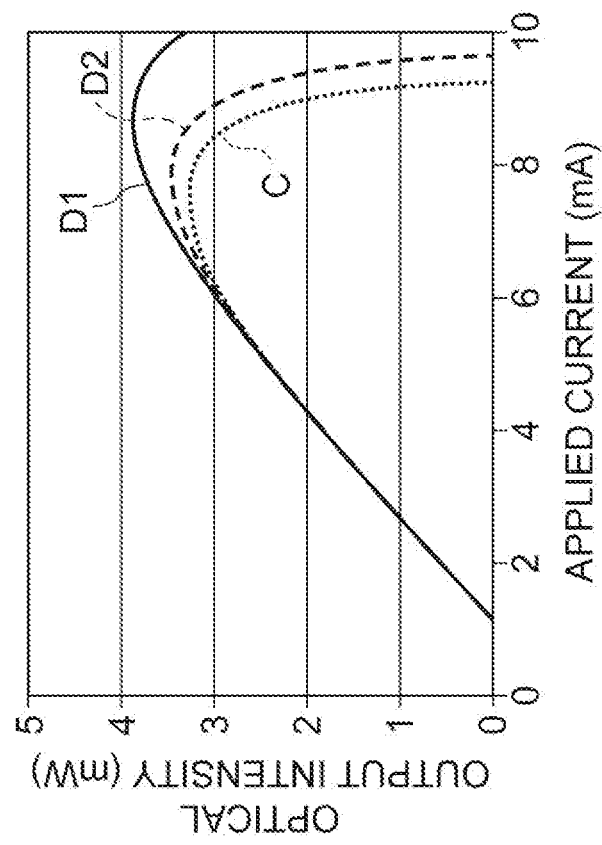
FIG. 5B is a graph showing a relationship between the applied current and the terminal voltage in the three kinds of vertical cavity surface emitting lasers.

FIG. 5A is a graph showing the relationship between the applied current and the light output intensity in three kinds of vertical cavity surface emitting lasers (D1, D2, and C). FIG. 5B is a graph showing the relationship between the applied current and the terminal voltage in the three kinds of vertical cavity surface emitting lasers (D1, D2, and C).

The first device D1 is provided with the structure shown in FIG. 2. In the vertical cavity surface emitting laser according to the first device D1, the lower DBR semiconductor region 16 is made of a GaAs/AlGaAs semiconductor superlattice (with an Al composition of 0.98), and the confining oxidation layer in the upper DBR region 40 includes AlAs.

The second device D2 is provided with the structure shown in FIG. 3. In the structure of the vertical cavity surface emitting laser according to the second device D2, the lower DBR semiconductor region 16 is made of a GaAs/AlAs semiconductor superlattice, and the oxidizing confining layer in the upper DBR region 40 includes AlGaAs (with an aluminum composition of 0.98).

The third device C is provided with the structure shown in FIG. 4. In the structure of the vertical cavity surface emitting laser according to the third device C, the lower and upper DBR regions in the post include AlGaAs (and AlAs) layers, each of which is surrounded by Al oxide as shown in FIG. 4.

Measurement Condition

Current is applied to each of the first, second and third devices D1, D2 and C to measure the optical output intensity of the vertical cavity surface emitting laser using an optical power meter. The measurement temperature is, for example, 25 degrees Celsius.

Referring to FIG. 5A, the vertical cavity surface emitting lasers exhibit similar optical output intensities, which increase with the applied current, in low applied currents. In high applied currents of 6 mA or more, the order of the optical output intensity from largest to smallest is as follows: the first device D1; the second device D2; and the third device C. The optical output intensity in the first device D1 monotonically increases up to a large applied current as compared to the second device D2.

Referring to FIG. 5B, the terminal voltages of the vertical cavity surface emitting lasers increase as the applied current increases. In the whole voltages in response to the applied currents, the third device C exhibits a terminal voltage larger than that of each of the first and second devices D1 and D2.

The first and second devices D1 and D2 each are provided with a lower DBR semiconductor region 16 made of semiconductor. The lower DBR semiconductor region 16 is disposed under the active layer 30 in the post 13 and can provide the active layer 30 with a heat dissipation path in the post 13. The third device C is, however, provided with a lower DBR region under the active layer in the post and provides the active layer with a heat dissipation paths made of both semiconductors and oxides. The first and second devices D1 and D2 each have a heat dissipation performance larger than that of the third device C because of the difference in material on the heat dissipation path.

The first and second devices D1 and D2 each include a lower DBR semiconductor region 16. The lower DBR semiconductor region 16 can also provide the active layer 30 in the post 13 with a current path made of semiconductor. The third device D3 is, however, provided with a lower DBR region under the active layer in the post, and provides the active layer with a current path made of semiconductor and oxide. In terms of the difference in the cross-sectional area of the semiconductor region in the current path between the first and second devices D1 and D2 and the third device C, the first and second devices D1 and D2 each have a lower device resistance than that of the third device C.

FIGS. 6A, 6B, 7A, 7B, 8A, and 8B are schematic views each showing a major step in the method of fabricating the vertical cavity surface emitting laser according to the embodiment. A description will be given of the method with reference to FIGS. 6A to 8B. In the following description, reference numerals in the description with reference to FIG. 1 are used to clarify the association between the fabricating method and the vertical cavity surface emitting laser fabricated thereby.

Figure 6A:
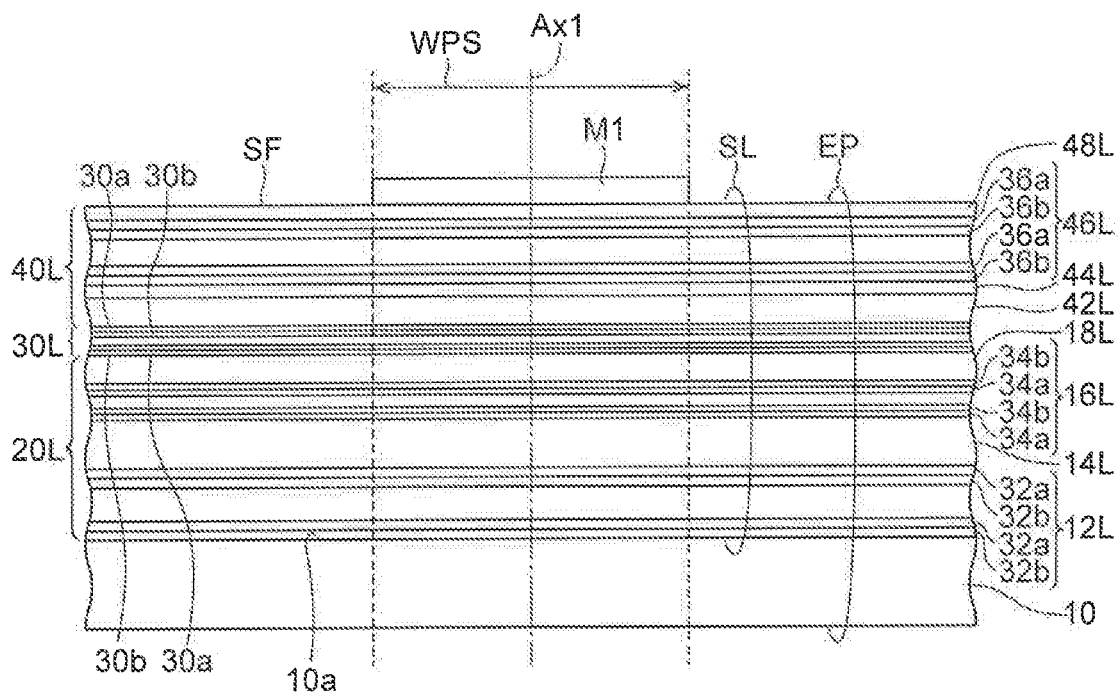
FIG. 6A is a schematic view showing a major step, which prepares an epitaxial substrate EP and form a first mask thereon, in the method of fabricating the vertical cavity surface emitting laser according to the embodiment.

The method includes a step for preparing an epitaxial substrate EP. In the embodiment, in order to prepare the epitaxial substrate EP, the epitaxial substrate EP is fabricated which includes a semiconductor stack SL and a substrate 10, such as a semiconductor wafer. As shown in FIG. 6A, the semiconductor stack SL is formed on the principal surface 10*a* of the substrate 10 to form the epitaxial substrate EP. The semiconductor stack SL can be grown by, for example, metal organic vapor phase epitaxy or molecular beam epitaxy.

The epitaxial substrate EP has a structures as follows. In the embodiment, the semiconductor stack SL includes a lower semiconductor stack 20L, a semiconductor stack 30L, and an upper semiconductor stack 40L. The lower semiconductor stack 20L is associated with the lower DBR region. The semiconductor stack 30L is associated with the active layer 30. The upper semiconductor stack 40L is associated with the upper DBR region 40. Specifically, the lower semiconductor stack 20L includes a semiconductor stack 12L, a semiconductor layer 14L, a semiconductor stack 16L, and a semiconductor layer 18L. The semiconductor stack 12L has undoped first semiconductor layers 32*a* and second semiconductor layers 32*b*. The semiconductor stack 16L has first and second semiconductor layers 34*a* and 34*b*, which are alternately arranged. The semiconductor layer 14L includes a heavily doped semiconductor associated with the lower contact layer 14. The semiconductor layer 18L includes an undoped semiconductor associated with the lower spacer layer 18. The semiconductor stack 30L includes one or more well layers 30*a* and one or more barrier layers 30*b*, which are arranged to form a multiple quantum well structure. The upper semiconductor stack 40L includes a semiconductor layer 42L, a semiconductor layer 44L, a semiconductor stack 46L, and a semiconductor layer 48L. The semiconductor layer 42L includes an undoped semiconductor associated with the upper spacer layer 42. The semiconductor layer 44L includes a high Al composition semiconductor layer, which allows the formation of a current confinement structure, with the largest aluminum composition in the upper semiconductor stack 40L. The semiconductor stack 46L includes first semiconductor layers 36*a* and second semiconductor layer 36*b*, which are alternately arranged, with respective aluminum compositions being smaller than the aluminum composition of the semiconductor layer 44L. The semiconductor layer 48L includes a heavily doped semiconductor associated with the upper contact layer 48. Growing the semiconductor stack 12L, the semiconductor layer 14L, the semiconductor stack 16L, the semiconductor layer 18L, the semiconductor stack 30L, the semiconductor layer 42L, the semiconductor layer 44L, the semiconductor stack 46L and the semiconductor layer 48L on the substrate 10 sequentially can form the epitaxial substrate EP.

The present method includes a step for forming a first mask M1 on the principal surface of an epitaxial substrate EP, and defines the shape of the post 13. As shown in FIG. 6A, the first mask M1 is formed on the principal surface SF of the semiconductor stack SL. The first mask M1 may include a silicon-based inorganic insulating film, such as SiN or $SiO_2$, and may have a thickness of 100 to 500 nanometers, for example, 500 nm in the example. The first mask M1 is formed by photolithography and etching. The first mask M1 has a pattern and an opening, which define the post. Specifically, the pattern (WPS) covers one part of the semiconductor stack and the opening is located on another part of the semiconductor laminate. The other part is to be removed by etching, thereby forming the post resulting from the one part covered with the pattern. The pattern of the first mask M1 has a diameter of, for example, 20 to 50 micrometers.

Figure 6B:
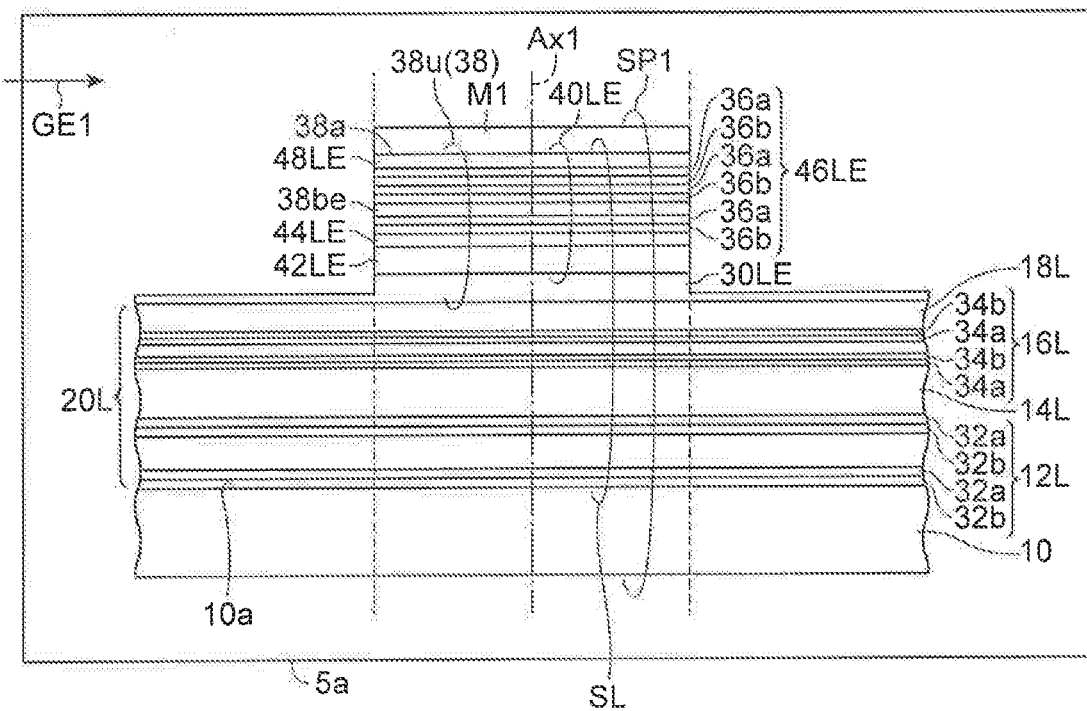
FIG. 6B is a schematic view showing a major step, which etches the epitaxial substrate with the first mask to form an upper portion of the post by etching, in the method according to the embodiment.

The present method includes a step for etching the epitaxial substrate EP with the first mask M1. As shown in FIG. 6B, the semiconductor stack SL is disposed in the etching apparatus 5*a*, which etches the semiconductor stack SL with the first mask M1 and an etchant GE1, which is supplied to the etching apparatus 5*a*. This etching forms a substrate product SP1 including the etched semiconductor laminate SL and the substrate 10. The etched semiconductor laminate SL has an upper portion 38*u* of the semiconductor post 38, which is formed on the principal surface 10*a* of the substrate 10. This etching is stopped at such a depth that the semiconductor layer 44L of the upper semiconductor stack 40L is completely removed at the opening of the first mask M1. The upper portion 38*u* of the semiconductor post 38 has a semiconductor upper face 38*a* and a side face 38*be*. The semiconductor upper face 38*a* is still covered with the first mask M1, and the semiconductor side face 38*be* has the side faces of the etched semiconductor layer 44LE, the etched semiconductor stack 46LE, and the etched semiconductor layer 48LE, which are in the etched upper semiconductor stack 40LE. The etching step uses, for example, a dry etching method with an etchant of, for example, hydrogen iodide or silicon chloride gas. If needed, the etching step can use a wet etching with an etchant of, for example, an aqueous solution containing phosphoric acid and aqueous hydrogen peroxide. In order to ensure the removal of the semiconductor layer 44L in the upper semiconductor stack 40L in the opening, the semiconductor layer 42L, which is just under the semiconductor layer 44L, can be etched to form the side face of the semiconductor layer 44L, and if needed, the semiconductor stack 30L, which is just under the semiconductor layer 42L, for the active layer 30 may be etched in addition to the semiconductor layer 42L. After the etching, the next step is applied to the substrate product SP1 without removing the first mask M1.

Figure 7A:
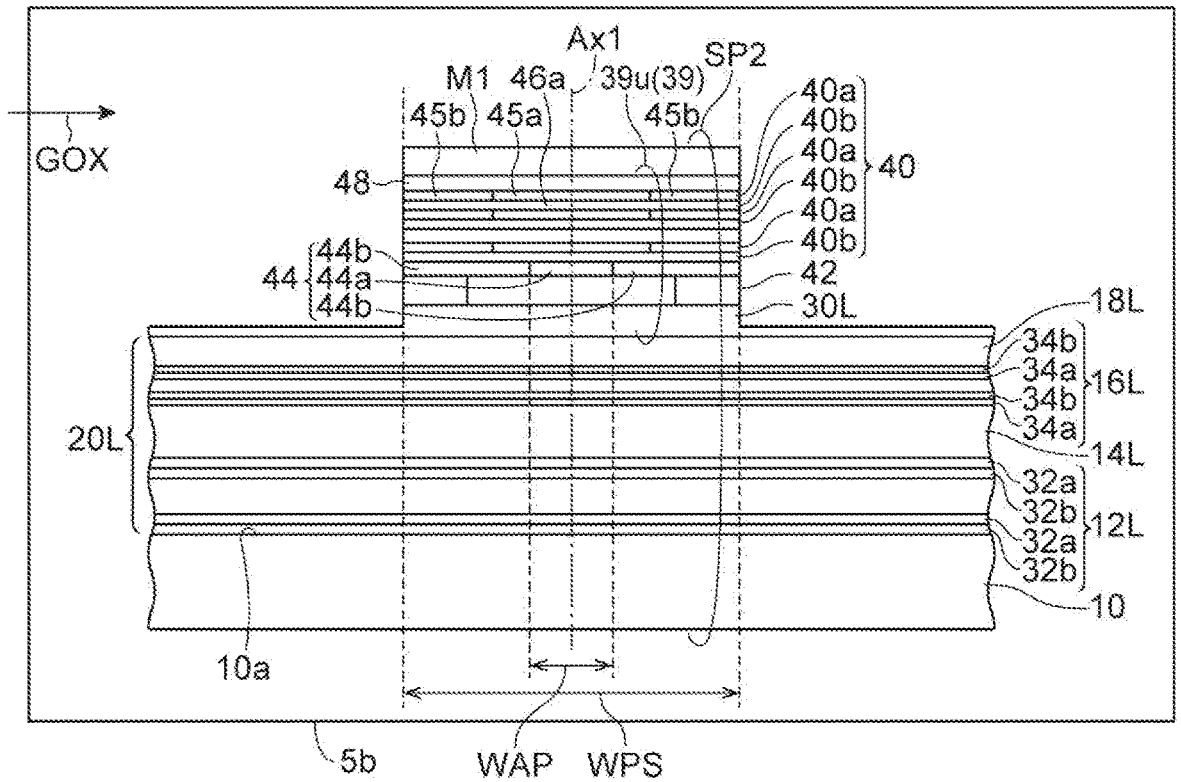
FIG. 7A is a schematic view showing a major step, which place the upper portion of the post in a steam, in the method according to the embodiment.

The method includes a step for exposing the upper portion 38*u* of the semiconductor post 38 of the substrate product SP1 to an oxidizing atmosphere. As shown in FIG. 7A, the substrate product SP1 is disposed in the oxidizing furnace 5*b* to oxidize the upper portion 38*u* of the semiconductor post 38 in an oxidizing atmosphere, which is formed by supplying gas GOX containing an oxidant, such as steam, to the oxidizing furnace 5*b*. This oxidation process produces the upper portion 39*u* of the post 39 from the upper portion 38*u* of the semiconductor post 38, thereby obtaining a substrate product SP2. The oxidation temperature can be, for example, 400 degrees Celsius, and the oxidation time can be, for example, 60 minutes. In the embodiment, the side faces of the etched semiconductor layer 48LE, the etched semiconductor stack 46LE, the etched semiconductor layer 44LE, the etched semiconductor layer 42LE and the etched semiconductor stacked layer 30LE, which appear on the side face of the upper portion 38*u* of the semiconductor post 38 of the substrate product SP1, are exposed to steam, thereby being oxidized inward in accordance with the Al compositions of the above side faces. The oxidation process produces the current confining structure 44 from the etched semiconductor layer 44LE of a high Al composition. The semiconductor layer 44LE has the highest Al composition in the upper portion 38u of the semiconductor post 38, and is changed into another structure by the exposure to an oxidizing atmosphere, thereby producing the current confining structure 44 from the semiconductor layer in the upper portion 39u of the post 39. The current confinement structure 44 includes a current aperture portion 44a of the III-V compound semiconductor and an insulator portion 44b. The oxidizing atmosphere also oxidizes other Al-containing semiconductor layers appearing on the side face of the upper portion 39u of the post 39, and for example, oxidizes the AlGaAs layers of the semiconductor stack 46L inward in accordance with their Al compositions. The oxidizing process changes the Al-containing semiconductor layers in the upper portion 39u of the post 39 into respective complex layers, each of which has an inner semiconductor portion, which is made of the original Al-containing semiconductor left without oxidization in the central portion in the upper portion 39u of the post 39, and an outer oxidized portion, formed by oxidation, which encircles the inner semiconductor portion. The oxidizing atmosphere does not substantially oxidize Al-free semiconductor appearing on the side face of the upper portion 39u of the post 39, thereby leaving the original semiconductor unchanged over the post 39. For example, the first and second semiconductor layers 36a and 36b of the etched semiconductor stack 46LE are oxidized in accordance with their Al compositions to change into the first and second layers 40a and 40b. After the oxidation, the first mask M1 is still left.

Figure 7B:
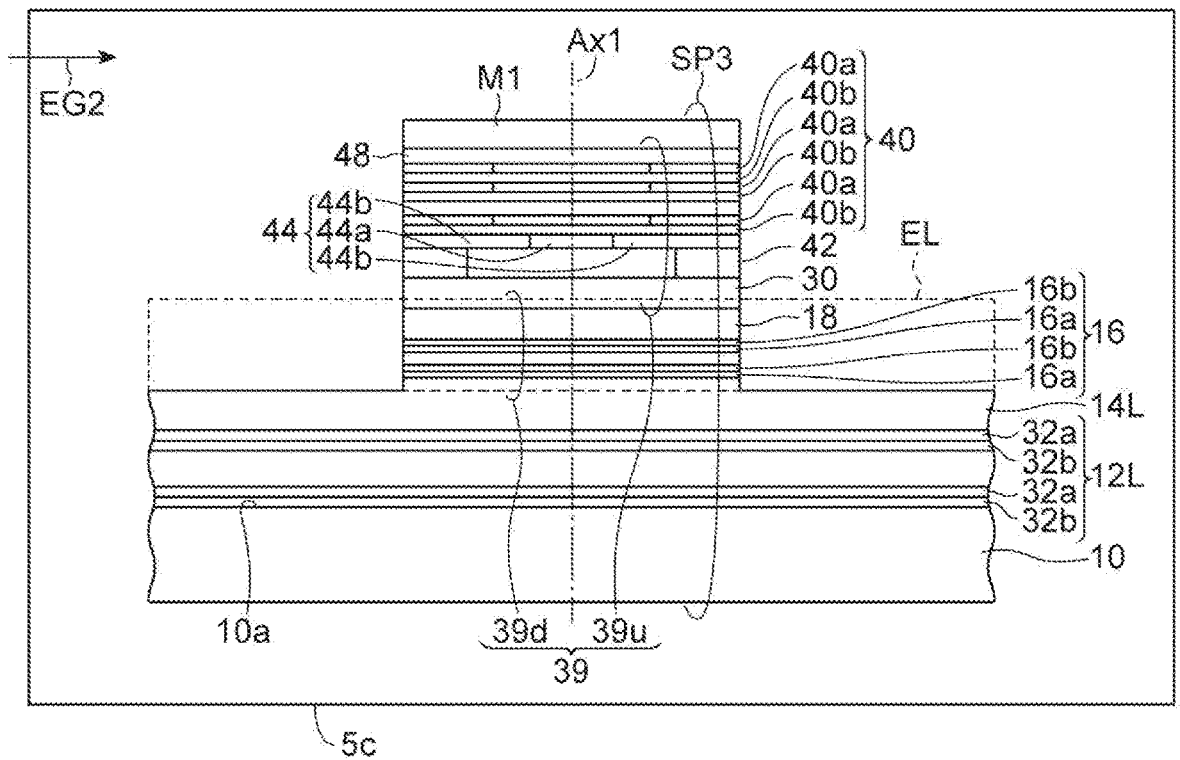
FIG. 7B is a schematic view showing a major step, which form a lower portion of the post by etching, in the method according to the embodiment.

The method includes a step for etching the substrate product SP2, which has the upper portion 39u of the post 39, with the first mask M1. As shown in FIG. 7B, after producing the post 39 from the semiconductor post 38, the remaining semiconductor stack 30L and lower semiconductor stack 20L are etched to form the lower portion 39d of the post 39. The substrate product SP2 is disposed, for example, in the etching apparatus 5c, and the etchant gas EG2 is supplied to the etching apparatus 5c. The semiconductor stack 30L and the lower semiconductor stack 20L are processed by, for example, dry etching with the first mask M1. The dry etching uses, for example, hydrogen iodide or silicon chloride gas as an etchant. If necessary, wet etching can be used in the present processing. In the etching step, the substrate product SP2 is etched to a depth of the semiconductor layer 14L. In the opening of the first mask, the etching removes the semiconductor stacked layer EL, indicated by the dot line in FIG. 7B, which includes the semiconductor stack 30L, the semiconductor layer 14L, the semiconductor stack 16L, and a part of the semiconductor layer 18L, thereby producing the substrate product SP3 from the substrate product SP2. The etching newly forms the lower portion 39d of the post 39, and the lower portion 39d of the post 39 has a bottom in the etched semiconductor layer 14L. The substrate product SP3 has an upper portion 39u and a lower portion 39d in the post 39. The lower portion 39d of the post 39 is provided with the etched semiconductor layer 14L (the lower contact layer 14), the etched semiconductor stack 16L (the lower DBR semiconductor region 16), and the etched semiconductor layer 18L (the lower spacer layer 18). After the second etching, the side face of the lower portion 39d of the post 39 is exposed to the atmosphere, but is not exposed to the high temperature oxidizing atmosphere in the oxidation furnace. The above processes having the two etching steps and the oxidizing step therebetween allows the lower portion 39d of the post 39 to have no aluminum oxide region that extends inward, as contrasted with the upper portion 39u of the post 39. The semiconductor stack 12L of the lower semiconductor stack 20L is not etched. The subsequent processes may change the post 39 slightly, but the proceeding and present processes substantially determine the shape of the post 39 for the vertical cavity surface emitting laser. After the etching, the first mask M1 is removed from the upper surface 39a of the post 39.

Figure 8A:
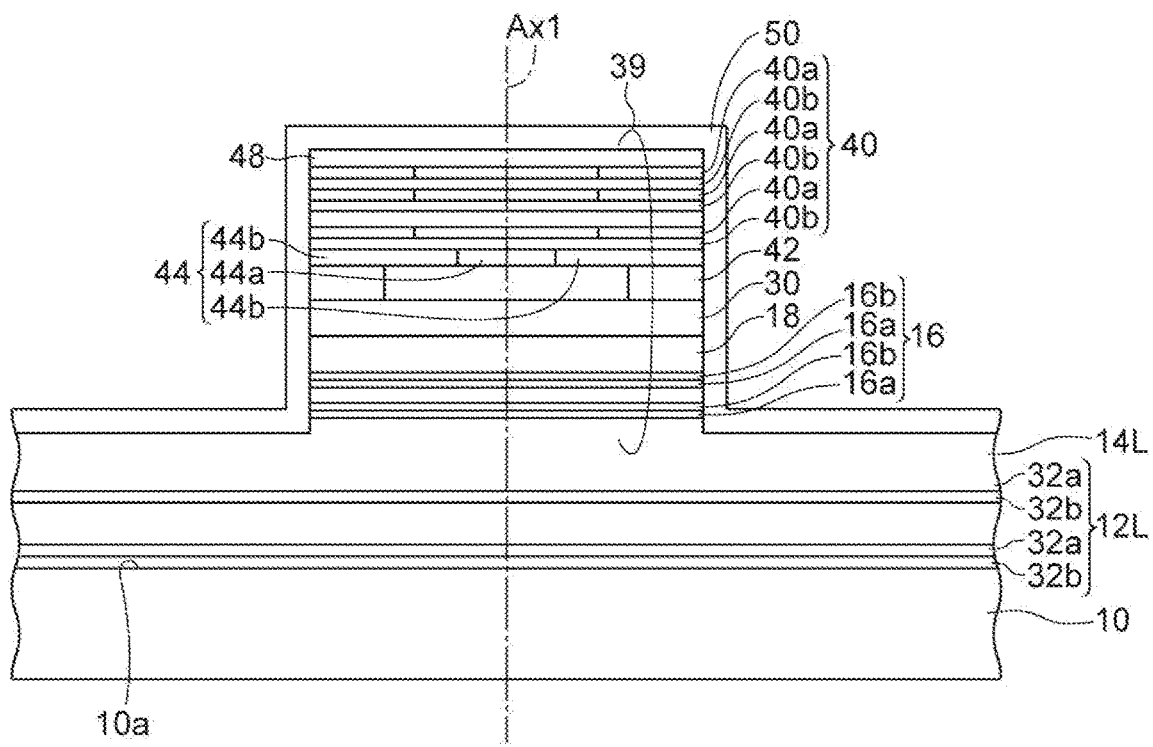
FIG. 8A is a schematic view showing a major step, which form a protective film on the post, in the method according to the embodiment.

The method includes, after removing the first mask M1, a step for growing a passivation film on the substrate product SP3, which has the upper face 39a of the post 39 and the side faces 39c of the upper and lower portions 39u and 39d. Specifically, after forming the post 39, as shown in FIG. 8A, the protective film 50 is formed to cover the surface of the substrate product SP3. The protective film 50 includes a silicon-based inorganic insulating film such as SiN or $SiO_2$, which can be grown by a film formation method, such as plasma CVD. The protective film 50 covers the upper and side faces 39a and 39c of the post 39 and the surface of the lower contact layer 14.

Figure 8B:
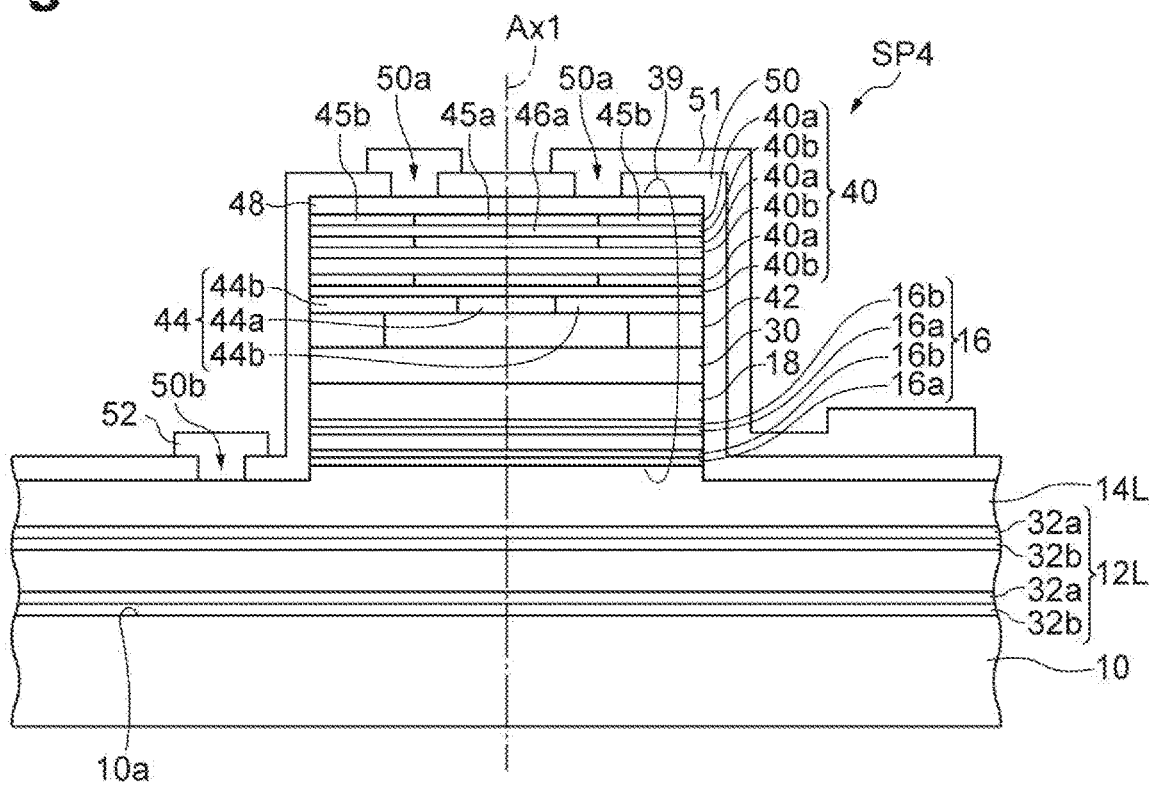
FIG. 8B is a schematic view showing a major step, which form electrodes, in the method according to the embodiment.

The method includes, after forming the protective film 50, a step for forming one or more electrodes for the vertical cavity surface emitting laser on the substrate product SP3. As shown in FIG. 8B, the protective film 50 is processed to form a first opening 50a and a second opening 50b therein, and a first electrode 51 and a second electrode 52 are formed in the first and second openings 50a and 50b of the protective film 50, respectively. The application of photolithography and etching to the protective film can form the first and second openings 50a and 50b, and then the first and second electrodes 51 and 52 are formed by, for example, respective lift-off processes, thereby forming the substrate product SP4. Specifically, each of lift-off processes uses a lift-off mask, which is formed on the protective film 50, and deposits metal for the electrode on the protective film 50 and the lift-off mask, for example, by vapor deposition. The removal of the lift-off mask forms the patterned metal, i.e., the electrode. The first and second electrodes 51 and 52 include respective metal laminates, such as AuGeNi and a gold plating layer. The substrate product SP4 is diced to form a semiconductor chip for the vertical cavity surface emitting laser.

The method of fabricating the vertical cavity surface emitting laser includes etching the epitaxial substrate EP to form the upper portion 38u of the semiconductor post 38; exposing the upper portion 38u of the semiconductor post 38 to the oxidizing atmosphere to form a current confining structure; and etching the lower semiconductor laminate to form the lower portion 39d of the post 39 after forming the current confining structure. These processes result in that the lower part 39d of the post 39 is not subjected to the oxidizing atmosphere that can form the current confining structure.

As described above, the present embodiment can provide a vertical cavity surface emitting laser with a high thermal conductivity allowing the dissipation of heat from the active layer. The present embodiment can also provide a method for fabricating a vertical cavity surface emitting laser with a high thermal conductivity allowing the dissipation of heat from the active layer.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A method for fabricating a vertical cavity surface emitting laser comprising:
    preparing an epitaxial substrate, the epitaxial substrate including a lower semiconductor laminate for a lower distributed Bragg reflecting region, a semiconductor laminate for an active layer, and an upper semiconductor laminate for an upper distributed Bragg reflecting region;
    forming a mask on the epitaxial substrate, the mask having a pattern defining a post for the vertical cavity surface emitting laser;
    etching the upper semiconductor laminate and the semiconductor laminate for the active layer with the mask to form a substrate product having an upper part of the post on the un-etched lower semiconductor laminate;
    without removing the mask, after the etching of the upper semiconductor laminate and the laminate for the active layer, exposing the upper part of the substrate product to an oxidizing atmosphere; and
    after exposing the upper part of the substrate product to the oxidizing atmosphere, etching the lower semiconductor laminate with the mask to form a lower part of the post, wherein
    the upper semiconductor laminate has a semiconductor layer of III-V compound semiconductor containing aluminum as a group III constituent element,
    the semiconductor layer reaches a side of the post,
    the exposing the upper part of the substrate product to an oxidizing atmosphere includes producing a current confining structure from the semiconductor layer, and
    the current confining structure has an insulating portion and a current aperture portion of the III-V compound semiconductor.

* * * * *